(12) United States Patent
Dinwoodie

(10) Patent No.: US 7,328,534 B2
(45) Date of Patent: Feb. 12, 2008

(54) SHINGLE SYSTEM

(75) Inventor: Thomas L. Dinwoodie, Piedmont, CA (US)

(73) Assignee: SunPower Corporation, Systems, San Jose, CA (US)

( * ) Notice: Subject to any disclaimer, the term of this patent is extended or adjusted under 35 U.S.C. 154(b) by 326 days.

(21) Appl. No.: 11/049,260

(22) Filed: Feb. 2, 2005

(65) Prior Publication Data

US 2005/0144870 A1 Jul. 7, 2005

Related U.S. Application Data (62) Division of application No. 10/078,916, filed on Feb. 20, 2002, now abandoned.

(51) Int. Cl.
 E04D 13/18 (2006.01)
 H01L 31/05 (2006.01)
(52) U.S. Cl. .................. 52/173.3; 52/519; 52/539; 52/542; 52/302.1; 136/244; 136/246
(58) Field of Classification Search ............ 52/536, 52/540, 539, 542, 523, 541, 173.3, 522, 527, 52/524, 525, 518, 520, 528, 535, 339, 543–545, 52/553, 554, 557, 559, 302.1, 519; 219/213; 136/257, 244, 246; 126/622
See application file for complete search history.

(56) References Cited

U.S. PATENT DOCUMENTS

| | | | | |
|---|---|---|---|---|
| 438,321 | A | * | 10/1890 | Linderman .................... 52/542 |
| 882,199 | A | * | 3/1908 | Fichter ......................... 33/41.3 |
| 3,769,091 | A | * | 10/1973 | Leinkram et al. ........... 136/246 |
| 4,001,995 | A | | 1/1977 | Cotter |
| 4,023,321 | A | * | 5/1977 | Smith ........................... 52/553 |
| 4,040,867 | A | | 8/1977 | Forestieri et al. |
| 4,111,188 | A | * | 9/1978 | Murphy, Jr. ................. 126/622 |
| 4,180,414 | A | | 12/1979 | Diamond et al. |
| 4,184,903 | A | * | 1/1980 | Lovelace et al. ........... 156/104 |
| 4,189,881 | A | | 2/1980 | Hawley |
| 4,315,096 | A | * | 2/1982 | Tyan et al. .................. 136/244 |
| 4,321,416 | A | | 3/1982 | Tennant |

(Continued)

FOREIGN PATENT DOCUMENTS

EP 0 949 686 A1 4/1999

(Continued)

OTHER PUBLICATIONS

Solar Systeme, "Das Laumans-Solar-Dachziegel-System," http://www.laumans.de/produkte/solar.html, Dec. 12, 2001.

*Primary Examiner*—Robert Canfield
*Assistant Examiner*—Jessie Fonseca
(74) *Attorney, Agent, or Firm*—James F. Hann; Haynes Beffel & Wolfeld LLP (57) ABSTRACT

A barrier, such as a PV module, is secured to a base by a support to create a shingle assembly with a venting region defined between the barrier and base for temperature regulation. Water resistant junctions may be formed between the bases of adjacent shingle assemblies of an array of shingle assemblies. The base may include an insulation layer underlying a water barrier. The base may also include a waterproofing element; the width and height of the barrier may be shorter than the width and height of the waterproofing element.

17 Claims, 8 Drawing Sheets

U.S. PATENT DOCUMENTS

| | | |
|---|---|---|
| 4,389,533 A | 6/1983 | Ames |
| 4,428,361 A * | 1/1984 | Straza ........................ 126/668 |
| 4,674,244 A | 6/1987 | Francovitch |
| 4,677,248 A | 6/1987 | Lacey |
| 4,769,086 A * | 9/1988 | Tanner et al. ............... 136/249 |
| 4,835,918 A | 6/1989 | Dippel |
| 4,860,509 A | 8/1989 | Laaly et al. |
| 4,886,554 A | 12/1989 | Woodring et al. |
| 4,936,063 A | 6/1990 | Humphrey |
| 5,056,288 A | 10/1991 | Funaki |
| 5,092,393 A | 3/1992 | Suehiro et al. |
| 5,092,939 A | 3/1992 | Nath et al. |
| 5,112,408 A | 5/1992 | Melchior |
| 5,232,518 A | 8/1993 | Nath et al. |
| 5,316,592 A | 5/1994 | Dinwoodie |
| 5,338,369 A | 8/1994 | Rawlings |
| 5,409,549 A | 4/1995 | Mori |
| 5,473,847 A | 12/1995 | Crookston |
| 5,505,788 A | 4/1996 | Dinwoodie |
| 5,561,953 A | 10/1996 | Rotter |
| 5,573,600 A | 11/1996 | Hoang |
| 5,575,861 A | 11/1996 | Younan et al. |
| 5,589,006 A | 12/1996 | Itoyama |
| 5,590,495 A | 1/1997 | Bressler et al. |
| 5,746,029 A | 5/1998 | Ulman |
| 5,746,839 A | 5/1998 | Dinwoodie |
| 5,787,653 A | 8/1998 | Sakai et al. |
| 5,845,446 A | 12/1998 | Funaki et al. |
| 5,935,343 A | 8/1999 | Hollick |
| 5,968,287 A | 10/1999 | Nath |
| 5,986,203 A | 11/1999 | Hanoka et al. |
| 5,990,414 A * | 11/1999 | Posnansky .................. 136/244 |
| 6,046,399 A | 4/2000 | Kapner |
| 6,061,978 A * | 5/2000 | Dinwoodie et al. ........ 52/173.3 |
| 6,065,255 A | 5/2000 | Stern et al. |
| 6,111,189 A | 8/2000 | Garvison et al. |
| 6,119,415 A | 9/2000 | Rinklake et al. |
| 6,148,570 A | 11/2000 | Dinwoodie et al. |
| 6,155,006 A | 12/2000 | Mimura et al. |
| 6,173,546 B1 | 1/2001 | Schafer |
| 6,182,403 B1 | 2/2001 | Mimura et al. |
| 6,201,179 B1 | 3/2001 | Dalacu |
| 6,245,987 B1 | 6/2001 | Shiomi et al. |
| 6,341,454 B1 | 1/2002 | Koleoglou |
| 6,360,491 B1 | 3/2002 | Ullman |
| 6,365,824 B1 | 4/2002 | Nakazima et al. |
| 6,453,629 B1 | 9/2002 | Nakazima et al. |
| 6,463,708 B1 | 10/2002 | Anderson |
| 6,465,724 B1 | 10/2002 | Garvison et al. |
| 6,495,750 B1 | 12/2002 | Dinwoodie |
| 6,498,289 B1 | 12/2002 | Mori et al. |
| 6,501,013 B1 | 12/2002 | Dinwoodie |
| 6,501,015 B2 | 12/2002 | Maloney et al. |
| 6,521,821 B2 | 2/2003 | Makita et al. |
| 6,534,703 B2 | 3/2003 | Dinwoodie |
| 6,570,084 B2 | 5/2003 | Dinwoodie |
| 2004/0098932 A1* | 5/2004 | Broatch .................... 52/173.1 |

FOREIGN PATENT DOCUMENTS

| | | |
|---|---|---|
| EP | 1 035 591 A1 | 12/1999 |
| WO | WO 96/24013 | 8/1996 |
| WO | WO 02/16707 A1 * | 2/2002 |

* cited by examiner

SHINGLE SYSTEM

CROSS REFERENCE TO RELATED APPLICATIONS

This application is a division of U.S. application Ser. No. 10/078,916 filed on 20 Feb. 2002 now abandoned, which is related to U.S. application Ser. No. 10/078,913 filed on 20 Feb. 2002 and U.S. application Ser. No. 10/078,918 filed on 20 Feb. 2002.

FEDERALLY SPONSORED RESEARCH OR DEVELOPMENT

This invention was made with government support under DOE SBJR contract DE-FG 03 99ER82862 awarded by the Department of Energy. The government has certain rights in this invention.

BACKGROUND OF THE INVENTION

Roofing shingles come in two primary types. A first type is typically flat and is designed so that there is a generous amount of overlap between adjacent shingles to create weather resistant joints to help ensure weather tightness. This first, edge-overlapping type may be flexible, such as the common composition or asphalt shingle, or it may be rigid, such as slate or some concrete shingles. A second type of roofing shingle has interlocking edges to secure the edges to one another and to help create effectively weather resistant joints to provide the desired weather tightness. The interlocking edges of this second, edge-interlocking type may, for example, have generally U-shaped edges creating lap joints, may have standing seam type of interlocking edges, or may have batten seam type of interlocking edges, or a combination thereof. A great deal of research has gone into the design of these interlocking edges. Shingles may be secured to the roofing substrate using, for example, adhesives or mechanical devices such as clips, which engage the edges of the shingles, and roofing nails, which secure the clips and/or the shingle itself to the roofing substrate. ATAS International, Inc. of Allentown, Pa. manufactures various types of interlocking metal shingles, including shingles having interlocking edges along all four sides. Owens Corning of Toledo Ohio also makes interlocking metal roofing panels sold under the trademark MiraVista®.

The widespread use of photovoltaic (PV) systems mounted to homes, businesses and factories is generally considered to be a desirable goal. Several factors are believed to be critical to the acceptance of PV systems, in particular by the individual homeowner. Primary among the factors are cost and aesthetics. One way of addressing both cost and aesthetics has been through the use of photovoltaic shingle assemblies. One way such shingle assemblies address the cost issue is by being used as a replacement for conventional shingles, preferably using similar mounting techniques. The aesthetic issue has begun to be addressed by the use of photovoltaic assemblies in the form of shingles or roofing tiles having similar configurations and dimensions as conventional shingles or roofing tiles, and by the use of appropriate colors and reflecting characteristics to help provide an aesthetically pleasing visual appearance to the roof or other building surface. See, for example, U.S. Pat. No. 5,112,408. However, photovoltaic shingle systems have not been as widely accepted as hoped-for because 1) PV mounted integrally with the building roof as shingles operate at higher temperatures, causing a reduction in PV electrical output due to an inverse relationship between temperature and PV efficiency; 2) the same higher operating temperatures approach or exceed the upper limit of the warranted PV operating temperature (typically 80 degrees C.) and serve to shorten the useful life of the PV shingle; 3) some products call for electrical connections between shingles to be made under the roof deck, requiring holes to be drilled through the roof deck which increases the likelihood of water leaks; 4) there has been poor aesthetic match of PV shingles in conjunction with the non-PV areas of the roof; 5) some PV shingles have been limited to amorphous silicon PV technology, which suffer from a low operating efficiency; and 6) the value of the PV shingle has typically been limited to the electrical output of the PV plus the material value of displaced conventional shingles when the product displaces conventional shingles.

See U.S. Pat. Nos. 3,769,091; 4,001,995; 4,040,867; 4,189,881; 4,321,416, 5,232,518; 5,575,861; 5,590,495; 5,968,287; 5,990,414; 6,061,978; and 6,111,189. See also EP1035591A1; and WO96/24013.

SUMMARY OF THE INVENTION

A first aspect of the invention is directed to a shingle system, for use on an inclined surface, comprising a plurality of shingle assemblies. At least some of the shingle assemblies include a water resistant base and a barrier, such as a PV module, secured to the base by a support to create the shingle assembly. The shingle assembly defines a venting region between the barrier and base for temperature regulation. Water resistant junctions are formed between the bases of adjacent shingle assemblies. The array of shingle assemblies may include rows of shingle assemblies. The shingle assemblies of one row may be laterally offset from or laterally aligned with the shingle assemblies of an adjacent row.

A second aspect of the invention is directed to a shingle system, for use on an inclined surface, comprising rows of shingle assemblies. At least some of the shingle assemblies include a water resistant base and a barrier, such as a PV module, secured to the base by a support to create the shingle assembly. The shingle assembly defines a venting region between the barrier and base for temperature regulation. The base comprises a water barrier overlying an installation layer, the water barriers of one row overlapping the water interiors of adjacent row.

A third aspect of the invention is directed to a shingle assembly, for use on an inclined surface, including a base and a barrier mounted to the base. The base includes a waterproofing element having a width and a height, the width and height of the barrier being shorter than the width and height of the waterproofing element of the base, whereby water resistance is gained when portions of the base of one shingle overlap portions of the base of adjacent shingles.

Various aspects of the present invention provide significant advantages to the user. A primary advantage relates to temperature regulation, the temperature regulation being achieved in part by the use of a venting region between the barrier and the base. The provision of a venting region helps reduce the temperature of the PV module, when the barrier comprises a PV module, which helps to increase the efficiency of the PV module over the efficiency of a PV module mounted to a support surface without a venting region. This reduction in temperature under typical summertime operating conditions in central California, such as Sacramento, has been found to be about 20° C., representing about a 10 percent increase in PV efficiency. This increase in efficiency helps to reduce the cost per unit energy for the system. The use of a venting region also helps to reduce the temperature of the support surface, typically the roof of a building. This reduction in temperature can result in very significant reductions in the air-conditioned system load due to a substantial reduction in heat gain through the roof. The calculated reduction in an air conditioning system load due to heat gain through the roof for a typical day in August in central California has been calculated to be about 90 percent. Further thermal benefits may be achieved through the use of a radiant barrier between the barrier and the base or by making the base a thermally insulating base. Energy savings are also increased when the barrier is a PV module used for the production of energy.

The present invention is suitable for both new construction and retrofit applications over existing roofing. In some retrofit applications, such as when an existing roof has clay or concrete tiles, it may be best to remove portions of the existing roofing tiles.

Other features and advantages of the invention will appear from the following description in which the preferred embodiments have been set forth in detail in conjunction with the accompanying drawings.

DESCRIPTION OF THE SPECIFIC EMBODIMENTS

Figure 1A:
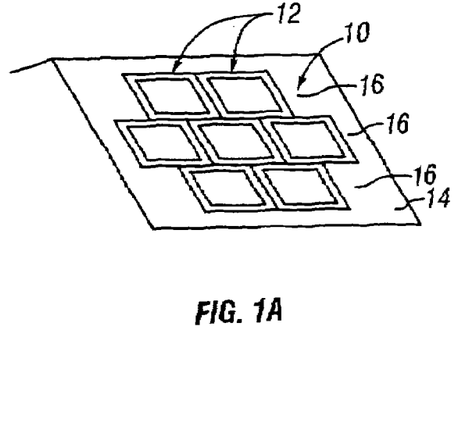
FIG. 1A is a simplified representation of an array of PV shingle assemblies with the shingle assemblies of one row laterally offset from the shingle assemblies of an adjacent row.
Figure 1B:
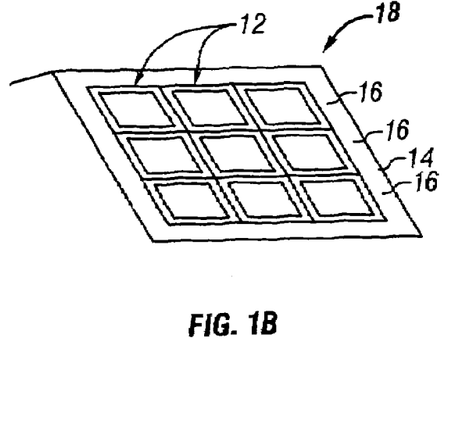
FIG. 1B is a simplified representation of an array of PV shingle assemblies with the shingle assemblies of one row laterally aligned with the shingle assemblies of an adjacent row.

The present invention is directed to shingle assemblies that can be mounted to inclined surfaces, such as the roof of a building, with the shingle assemblies in one row being either laterally offset or laterally aligned with the shingle assemblies in adjacent rows. FIG. 1A illustrates an array 10 of PV shingle assemblies 12 mounted to an inclined roof 14 with the rows 16 of shingle assemblies 12 laterally offset from one another. FIG. 1B shows an array 18 of PV shingle assemblies 12 also mounted to an inclined roof 14 with the rows 16 of shingle assemblies 12 laterally aligned with the shingle assemblies in an adjacent row. While the present invention will typically refer to the inclined support surface as roof 14, other inclined support surfaces, such as shed, deck, walkway covering, lattice structure, may also be used.

Various embodiments of shingle assemblies will be described below with like elements being referred to with like reference numerals.

Figure 2:
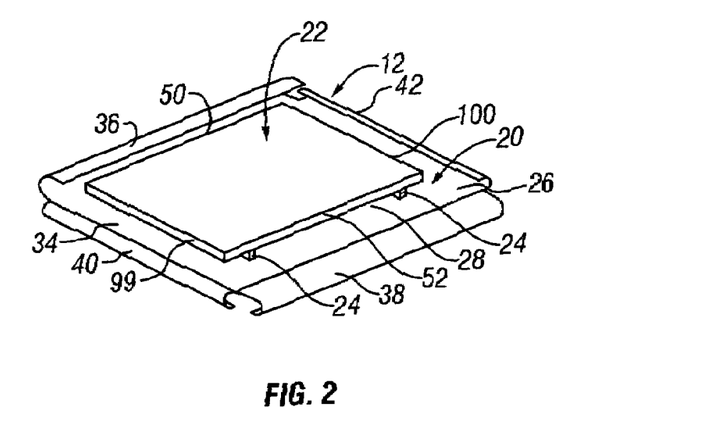
FIG. 2 is a simplified top isometric view of an edge-interlocking PV shingle assembly made according to the invention.
Figure 3:
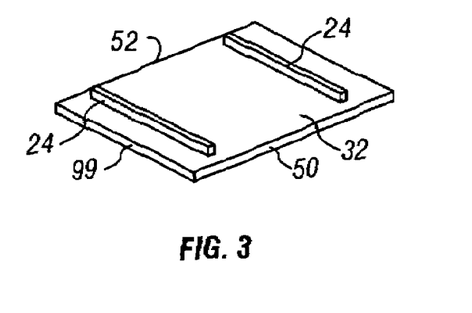
FIG. 3 is a simplified bottom isometric view of the PV module and supports of FIG. 2.

FIGS. 2 and 3 illustrate an edge-interlocking PV shingle assembly 12 comprising a base 20, a PV module 22 and a pair of supports 24 securing PV module 22 to the upper surface 26 of base 20. A venting region 28 is defined between PV module 22 and base 20. The provision of venting region 28 provides several advantages, including moderating the temperature of PV module 22 and reducing the amount of heat passing through roof 14 and into the underlying building. The efficiency of conventional PV modules 22 can be increased by reducing the temperature of the PV modules. Reducing the amount of heat passing into the building by the use of PV modules 12 can lower the air conditioning load by a significant amount. In addition, further thermal insulation can be achieved by making base 20 of a thermal insulating material (or attached to a thermal insulating material) and by using one or more low emissivity elements 30, typically at the inner surface 32 of PV module 22, at upper surface 26 of base 20 or at a position somewhere therebetween. Three different positions for elements 30 are suggested in FIG. 5C.

Shingle assembly 12 uses PV module 22 as its barrier. However, other types of barriers, such as a thermally insulating panel, could be used instead of PV module 22. PV module 22 may be of a conventional, commonly available type, such as available from Shell Solar, BP Solar, Kyocera, Astropower, Sharp, Photowatt, or Uni-Solar, or an unconventional, specially made or adapted type of PV module.

Figure 4:
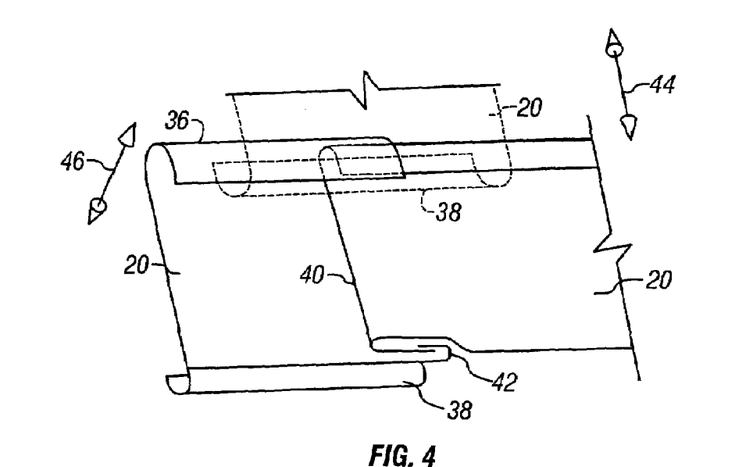
FIG. 4 is a simplified view showing the interconnections between the U-shaped edge extensions of the bases of FIG. 2.

Base 20 of shingle assembly 12 has conventional recurved edges to provide weatherproofing and interengagement between adjacent PV shingle assemblies. Specifically, base 20 has an upwardly curving top edge 36, a downwardly curving bottom edge 38, a downwardly curving first lateral edge 40 and an upwardly curving second lateral edge 42. Each of these recurved lateral edges is generally U-shaped. Other conventional or unconventional interengageable edges may be used as well, and recurved edges 40 and 42 could be eliminated in favor of simple overlapping of the lateral edges. FIG. 4 illustrates the interengagement of the interengageable top and bottom edges 36, 38 and of first and second lateral edges 40, 42. Note that PV modules 22, supports 24 and certain of the U-shaped edge extensions are not shown in FIG. 4 for clarity. The interengagement of edges 36, 38 resists disengaging forces along line 44, that is along a line oriented perpendicular to edges 36, 38 and along a plane oriented parallel to bases 20 (that is generally parallel to the roof). The interengagement of edges 36, 38 also resists disengaging forces along line 46, that is along a line oriented perpendicular to edges 36, 38 and along a plane oriented perpendicular to bases 20 (that is generally perpendicular to the roof). The interengagement of edges provides weather-resistant joints at the edges and helps to stabilize the array against wind uplift forces by connecting adjacent shingle assemblies to one another.

Figure 5A:
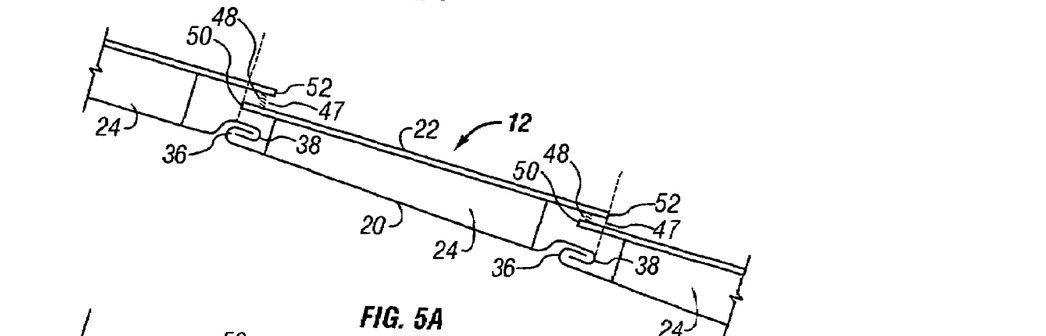
FIG. 5A is a simplified side view showing the interconnections between adjacent rows of edge-interlocking PV shingle assemblies with the top and bottom edges of the PV module being generally aligned with the top and bottom edges of the base.
Figure 5B:
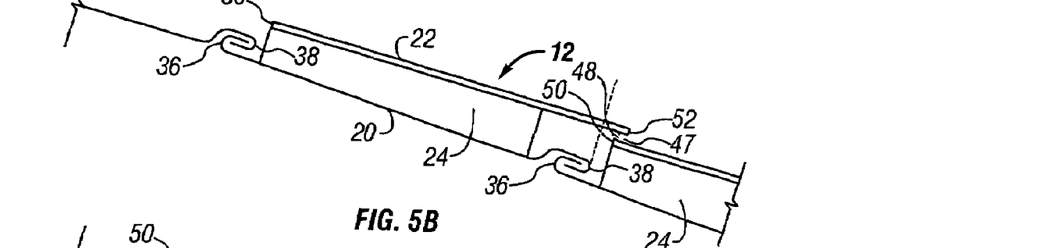
FIG. 5B is a simplified side view showing the interconnections between adjacent rows of edge-interlocking PV shingle assemblies with the top edge of the PV module being setback inwardly of the top edge of the base and the bottom edge of the PV module overhanging the bottom edge of the base.
Figure 5C:
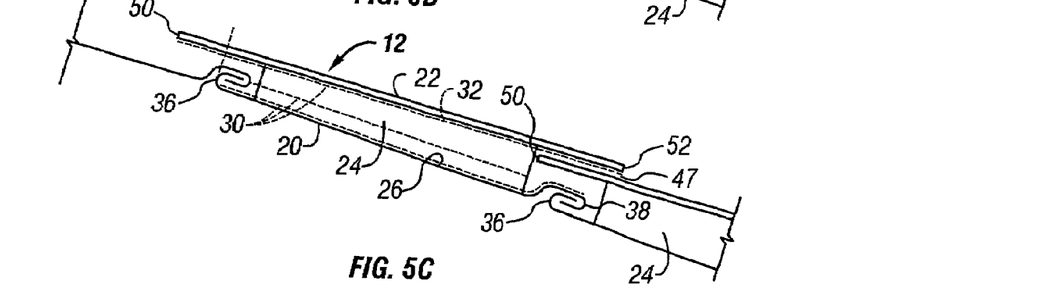
FIG. 5C is a simplified side view showing the interconnections between adjacent rows of edge-interlocking PV shingle assemblies with the top edge of the PV module overhanging the top edge of the base and the bottom edge of the PV module being generally aligned with the bottom edge of the base.

PV modules 22 may overlap in a shingled manner to permit rain to travel down from one PV module 22 to another while not preventing the flow of air through venting region 28. FIG. 5A illustrates an embodiment in which the top edge 50 of PV module 22 is generally aligned with the top edge 36 of base 20 and the bottom edge 52 of PV module 22 is generally aligned with bottom edge 38 of base 22. However, due to the interengagement of top and bottom edges 36, 38 of bases 20, the bottom edge 52 of an upslope PV module overlaps the top edge 50 of a downslope PV module 22. An air-permeable strip 48 may be situated along the vent entry 47 to help prevent debris from entering venting region 28, while facilitating air flow into region 28. Strip 48 may be made from, for example, mesh, screen, or louvered or otherwise perforated plastic or metal sheets. Shingling of PV modules 22 can occur in other ways, such as when, as shown in FIG. 5B, top edge 50 is set back inwardly of the top edge 36 of base 20 and bottom edge 52 of PV module 22 overhangs bottom edge 38 of base 20. Also, FIG. 5C shows an embodiment in which top edge 50 overhangs top edge 36 while bottom edges 52, 38 are generally aligned. Other shingling arrangements and configurations are also possible. Vent entry 47 preferably has an average height of about 0.1-5 cm, more preferably about 0.6-5 cm and even more preferably about 0.6-1.9 cm.

Supports 24 separate PV module 22 from base 20 by an average distance of about 0.6 cm-10 cm, and preferably about 1.2 cm-5 cm, and more preferably about 1.9 cm-3.8 cm. As indicated in FIGS. 5A-5C, the separation between PV module 22 and base 20 may vary to create a tapered venting region 28. This variation in separation permits bottom edge 52 of PV module 22 to overlap top edge 50 of an adjacent PV module.

Figure 6:
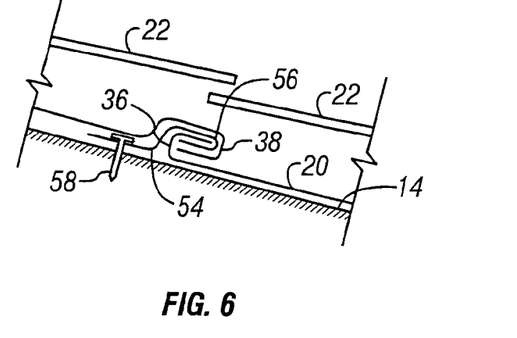
FIG. 6 illustrates the use of a recurved clip nailed to a support surface to secure interlocking edges of adjacent bases to the support surface.

Shingle assemblies 12 may be secured to roof 14 using conventional or unconventional structures and methods. One such method is shown in FIG. 6 in which a clip 54, having a U-shaped, recurved end 56, engages the interengaging top and bottom edges 36, 38 of base 20. Clip 54 is secured to roof 14, or other support surface, by a nail 58 or other suitable fastener. Adhesive may be used in addition to or instead of mechanical fasteners.

Figure 7:
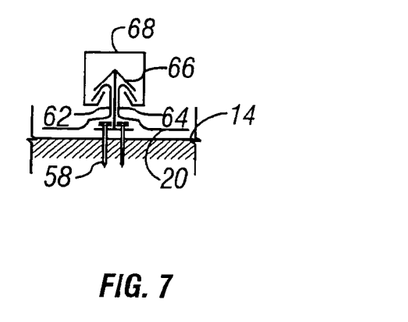
FIG. 7 illustrates a batten seam including two upwardly extending edges secured to a support surface by fasteners, the seam covered by a resilient, generally U-shaped batten.
Figure 8:
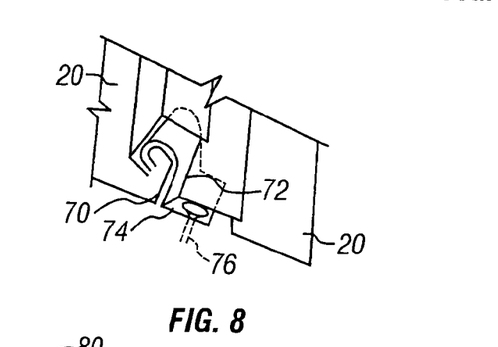
FIG. 8 illustrates a standing seam type of edge joint with a clip engaging the interlocking edges, the clip being secured to the underlying support surface by a fastener.

FIG. 7 illustrates an alternative embodiment in which the first and second upwardly extending lateral edges define a generally conventional batten seam 60 by which the edges interengage and are secured to the roof. Batten seam 60 includes first and second upwardly extending edges 62, 64 that are secured together and to roof 14 by clips 66 and by a resilient, generally U-shaped batten 68. Clips 66 are secured to roof 14 using nails 58. FIG. 8 illustrates a further alternative embodiment in which upwardly extending lateral edges 70, 72 define a generally conventional standing seam. Edges 70, 72 are configured to engage one another with edge 72 covering edge 70; a clip 74 is secured to the support surface with a fastener 76 and is configured to engage the upper portion of edge 70 and to be covered by edge 72. Other types of conventional and unconventional batten seam and standing seam constructions may be used as well. Batten and standing seam constructions will typically be used to join the lateral edges of shingle assemblies; however, in some situations upwardly extending seams may be used to join the top and bottom edges of adjacent shingle assemblies, such as along a ridgeline of a roof. Base 20 is preferably a water resistant, or more preferably, a waterproof base. Base 20 and Supports 24 may be made of a variety of materials including metal, coated metal, plastic, ceramics, concrete, fiber-reinforced concrete, felt, bitumens, vulcanized elastomers, EPDM, polystyrene, coated polystyrene, neoprene, CSPE, CPE, PIB, NBE, thermoplastics, PCV and EIP.

Figure 9:
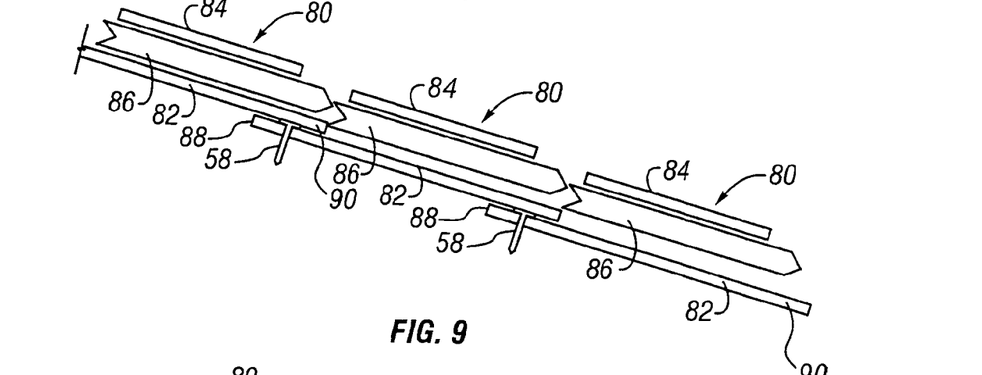
FIG. 9 is a simplified side view illustrating three rows of edge-overlapping type of PV shingle assemblies including interlocking supports that extend beyond the top and bottom edges of the PV modules to engage the supports of the adjacent rows of PV modules.
Figure 10:
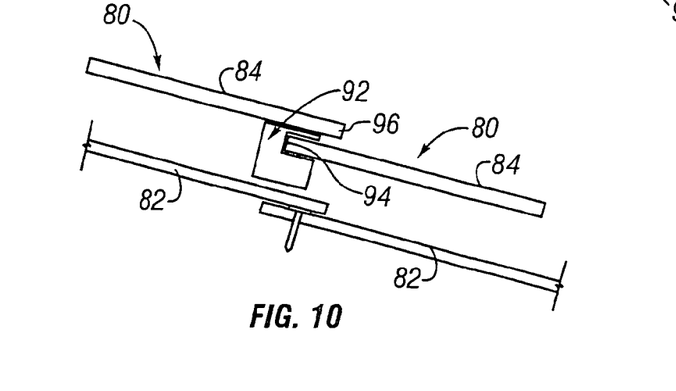
FIG. 10 illustrates the use of a stiffening bracket at the overlap between the PV modules of adjacent rows of PV assemblies.

FIG. 9 illustrates an alternative embodiment of the invention including edge-overlapping PV shingle assemblies 80. Each PV shingle assembly 80 includes a generally flat base 82 to which a PV module 84 is secured by supports 86. In the embodiment of FIG. 9, supports 86 are interlocking supports to help stabilize the shingle assemblies. FIG. 9 shows how the top and bottom edges 88, 90 of bases 82 overlap one another to provide weather-resistant junctions. FIG. 10 illustrates another edge-overlapping shingle assembly in which one or more stiffening brackets 92 are used between the overlapping top and bottom edges 94, 96 of PV module 84. Brackets 92 may be used in addition to supports 86 or, in appropriate cases, may act as the supports. Brackets 92 may come pre-attached to the barrier 84 or base 82, and may incorporate the electrical connections when barrier 84 is a PV module.

Figure 11:
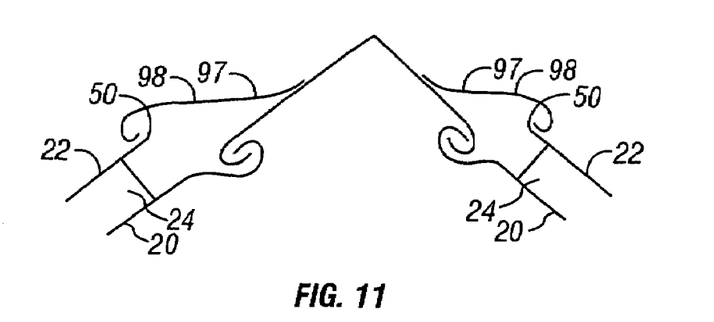
FIG. 11 is a simplified side view illustrating the use of wind deflectors at the ridge of a building and at the edge of arrays of shingle assemblies to help promote proper airflow through the venting regions between the barriers and the bases of the shingle assemblies.

FIG. 11 illustrates the use of deflectors 97 adjacent to the top edges 50 of PV modules 22. Deflectors 97 are spaced apart from PV modules 22 for proper air circulation, debris prevention, and aesthetics. The upper edges 98 of deflectors 97 are generally aligned with PV modules 22 and may, as shown in FIG. 11, overlap the adjacent edges of PV modules 22. Deflectors 97 help reduce wind uplift forces on PV modules 22, and help to prevent debris, such as leaves and needles, from entering the venting region 28. Deflectors 97 are shown along top edges 50 of PV modules 22; they may be used along all or parts of top and bottom edges 50, 52 and lateral edges 99, 100 of PV module 22. Also, Deflectors 97 may be used with edge-overlapping PV shingle assemblies 80 as well as the edge-interlocking PV shingle assemblies 12 illustrated in FIG. 11. Deflectors 97 may have shapes other than those shown in FIG. 11, and may be made of solid or porous material, such as sheet metal, plastic, fiberglass, or other suitable material. Air-permeable strips 48 may be used in conjunction with deflectors 97.

Figure 12:
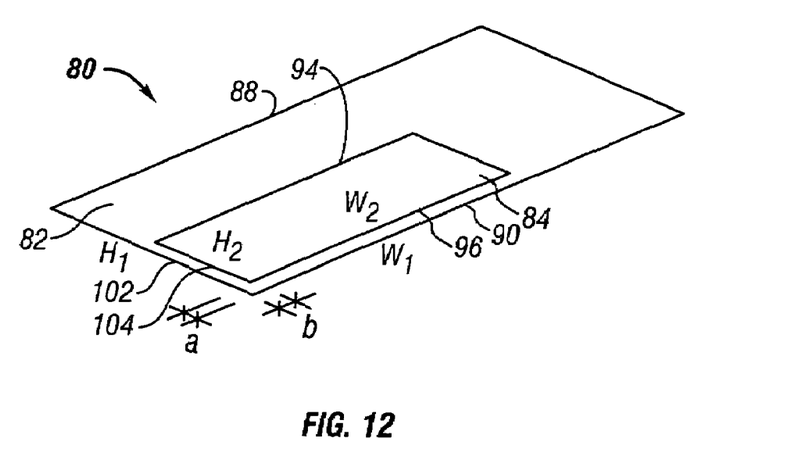
FIG. 12 is a simplified isometric view of an edge-overlapping PV shingle assembly in which the base is a sheet of flexible, weather resistant material and the PV module is shown spaced apart from the bottom edge and the first lateral edge of the base by distances a and b.
Figure 13:
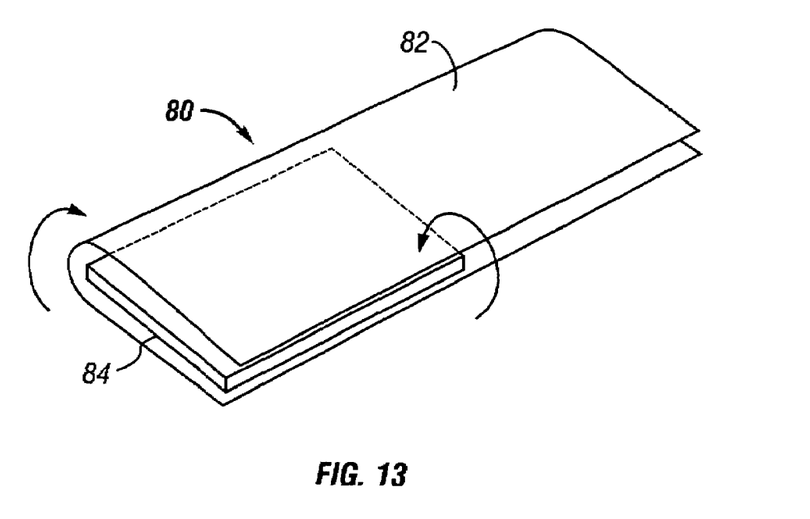
FIG. 13 illustrates how the flexible base of the shingle assembly of FIG. 12 may be folded over the PV module for shipping.

FIG. 12 is a simplified view of an edge-overlapping PV shingle assembly 80 including a PV module 84 mounted to a flexible base 82. Base 82 and PV module 84 have heights and widths $H_1$, $H_2$ and $W_1$, $W_2$. Width $W_2$ may be about 102%-200% of width $W_1$ and height $H_1$ may be about 110%-220% of height $H_2$. Preferably, width $W_2$ is about 102%-150% of width $W_1$ and height $H_1$ is about 110%-150% of height $H_2$ More preferably, width $W_2$ is about 120%-150% of width $W_1$ and height $H_1$ is about 120%-150% of height $H_2$ Lateral edge 102 of base 82 is spaced apart from lateral edge 104 of PV module 84 by a distance b while bottom edge 90 of base 82 is spaced apart from bottom edge 96 of PV module 84 by a distance a. Preferably, distance a is about 0-5 cm and the distance b is about 3-50 mm. More preferably, distance a is about 0-2.5 cm and the distance b is about 3-13 mm. Base 82 is, in the embodiment of FIGS. 12 and 13, flexible to permit base 82 to be folded over on top of PV module 84, as suggested in FIG. 13, for transport and storage. Weather resistance between adjacent bases 82 is provided by one or more of, for example, overlap of the bases, adhesive strip on the underside of the bases (particularly near to and parallel to the upper edge 88), or by other means. Base 82 is preferably at least somewhat flexible or compliant and may be made from a variety of materials such as EPDM, felt, fiberglass, bitumens, vulcanized elastomers, sheet metal, coated metal, plastic, ceramics, concrete, neoprene, CSPE, CPE, PIB, NBE, thermoplastics, PCV and EIP.

Figure 14:
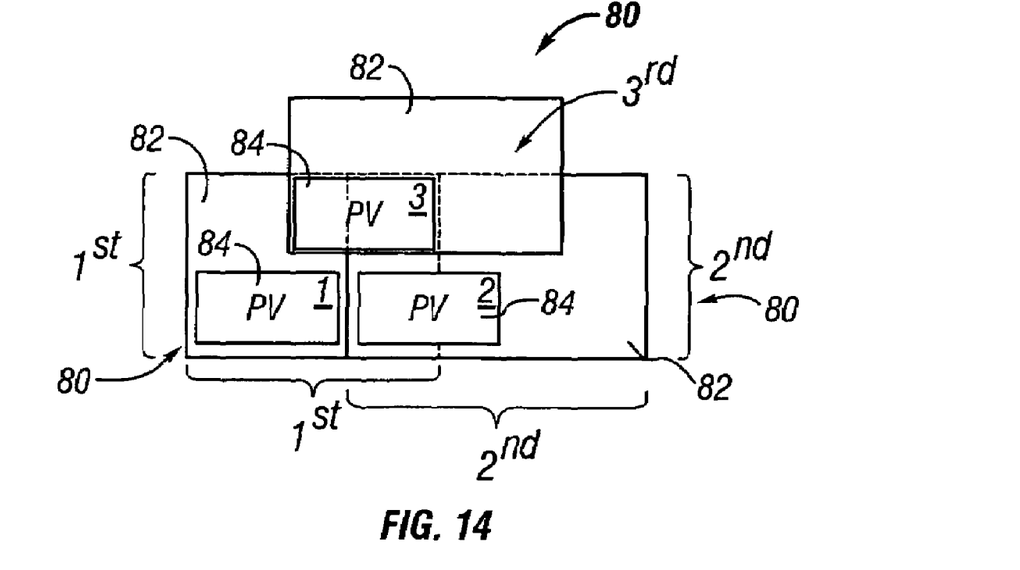
FIG. 14 illustrates a laterally offset array of edge-overlapping shingle assemblies.
Figure 15:
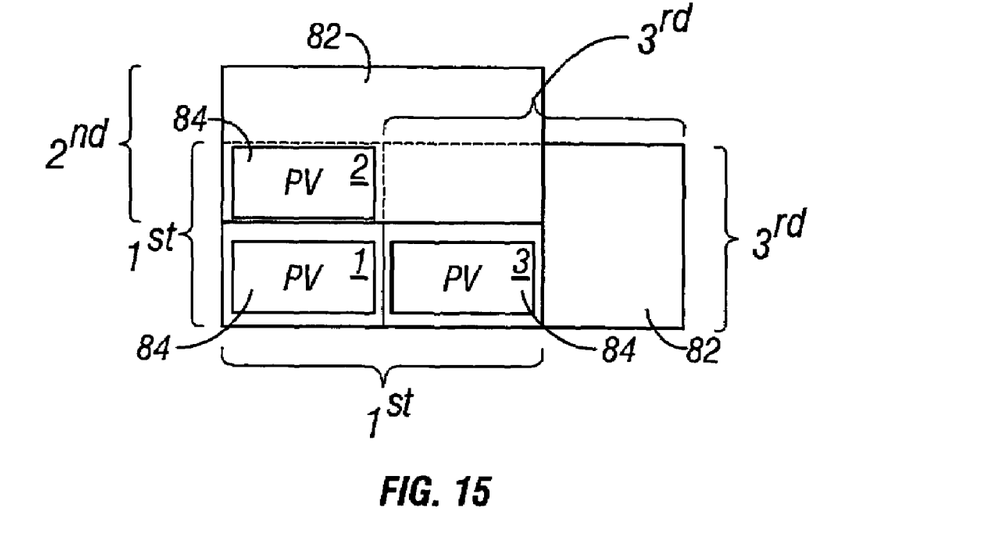
FIG. 15 illustrates a laterally aligned array of edge-overlapping shingle assemblies.

FIG. 14 illustrates three edge-overlapping PV shingle assemblies 80 forming a laterally offset array of edge-overlapping PV shingle assemblies 80. The order of placement of shingle assemblies 80 of FIG. 14 is indicated in the figure by the indications 1st, 2nd and 3rd. Therefore, shingle assemblies 80 of FIG. 14 are mounted to the support structure a row at a time, as is conventional. FIG. 15 illustrates three edge-overlapping PV shingle assemblies 80 forming a laterally aligned array of edge-overlapping PV shingle assemblies 80. The order of placement of shingle assemblies 80 of FIG. 15 is also indicated in the figure by the indications 1st, 2nd and 3rd. The order of placement of the second and the third shingle assemblies 80 of FIG. 15 may be reversed so that the order of placement is the same as in FIG. 14. As can be seen by comparing FIGS. 14 and 15, there is no difference in the weatherproofing along the overlapping lateral edges. Nor is there a significant difference between the overlap of the top and bottom edges; the main difference is one of aesthetics.

Figure 16:
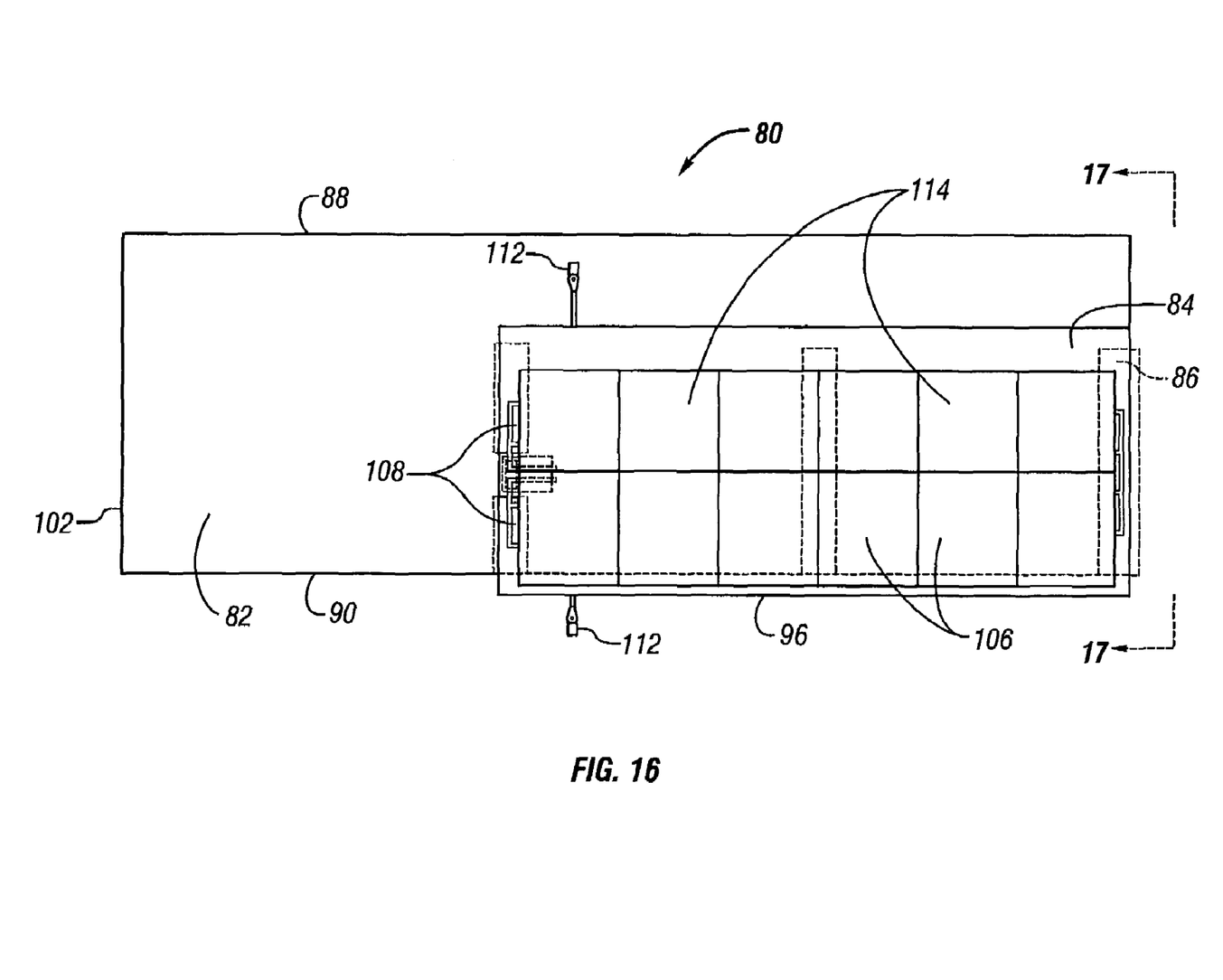
FIG. 16 is a top plan view of an edge-overlapping shingle assembly illustrating certain electrical connectors.
Figure 17:
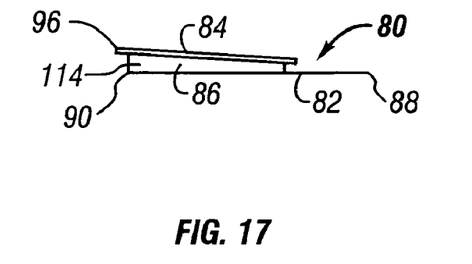
FIG. 17 is a side view of the assembly of FIG. 16 taken along line 17-17.

FIGS. 16 and 17 illustrate an edge-overlapping shingle assembly 80 including a base 82 and a PV module 84. PV module 84 is supported above base 82 by supports 86. FIG. 16 suggests that PV module 84 includes an array of 12 separate PV cells 106. PV cells 106 are electrically connected to one another through internal connections, such as suggested by electrical conductors 108. Alternatively, as with some thin-film PV modules, there would be no discrete PV cells 106 and no tabs 108. PV module 84 is electrically coupled to adjacent PV modules through electrical connectors 112. Whereas connectors 112 are shown as discrete wires with connector ends, connectors 112 may be embedded or otherwise integral to either base 82, spacer 86 or PV module 84. Venting regions 114 are defined between PV module 84 and base 82. Bottom edge 96 of PV module 84 overhangs, that is extends beyond, bottom edge 90 of base 82 to permit PV modules 84 of shingle assemblies 80 of FIGS. 16 and 17 to be arranged similarly to PV modules 22 of FIG. 5B. Alternatively, spacer 86 may be shaped such that the top surface of PV modules 84 are co-planar across shingle assembly 80, presenting a skylight-like appearance rather than a shingled appearance similar to that shown in FIGS. 9 and 19.

Figure 18:
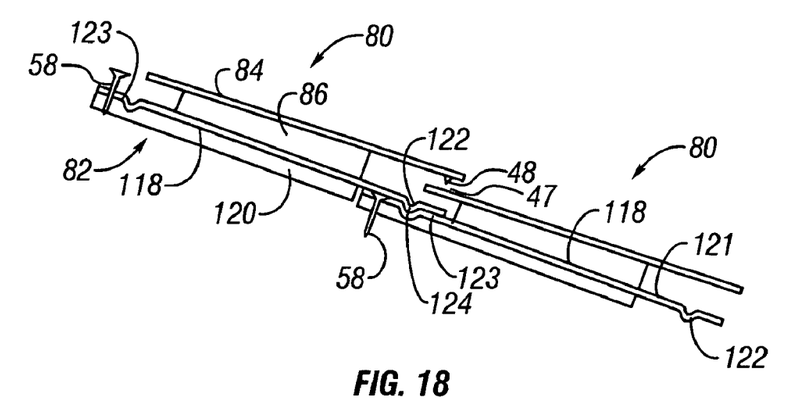
FIG. 18 is a simplified side view illustrating two rows of edge-overlapping type of PV shingle assemblies in which the base includes a water barrier mounted on top of a block of thermal insulation.
Figure 19:
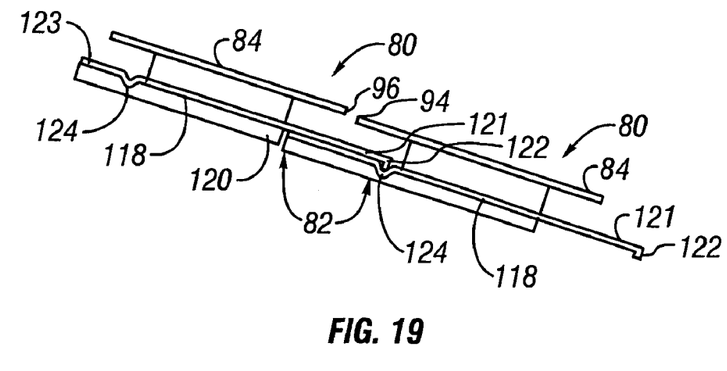
FIG. 19 illustrates two rows of edge-overlapping type of PV shingle assemblies similar to FIG. 18 but with the PV modules in a skylight type of arrangement.
Figure 20:
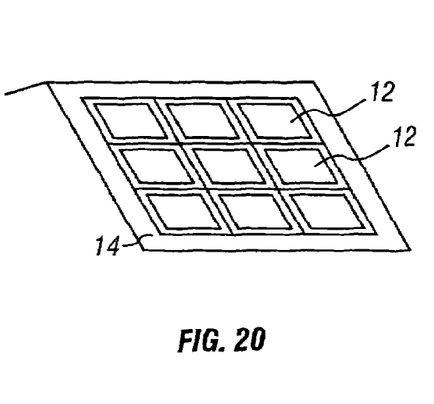
FIG. 20 is a simplified representation of three rows of PV shingle assemblies.
Figure 21:
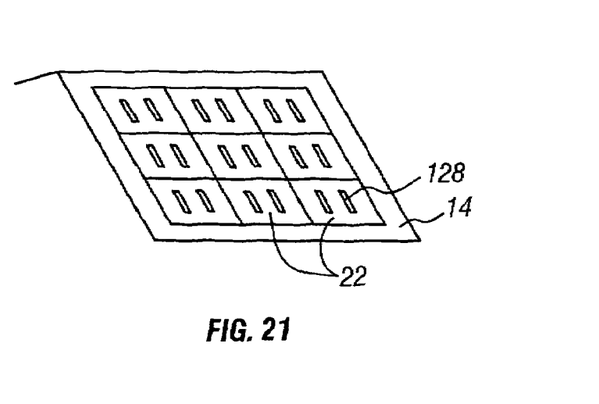
FIG. 21 shows the array of FIG. 20 with the PV modules removed.
Figure 22:
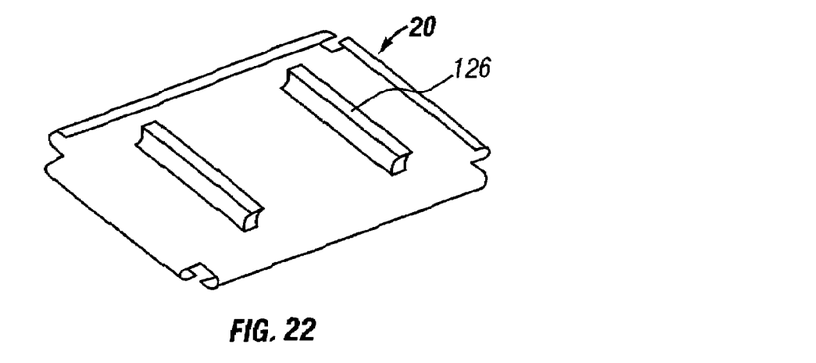
FIG. 22 is a large view of one of the bases of FIG. 21 showing a pair of bottom support members.
Figure 23:
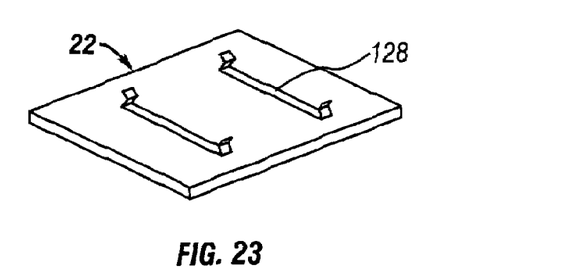
FIG. 23 is a simplified bottom isometric view of a PV module of FIG. 20 showing a pair of clip-type top support members secured thereto.

FIG. 18 illustrates two rows of edge-overlapping PV shingle assemblies 80 similar to the assemblies of FIGS. 9 and 10. The main difference relates to base 82. Base 82 includes a water barrier 118 overlying an insulation block 120. The lower and upper portions 121, 123 of water barriers 118 have lower and upper, generally U-shaped, interengaginng regions 122, 124 which interengage to create water blocks for the system. Sealants and/or adhesives may be used the in addition to or instead of regions 122, 124. FIG. 19 illustrates a further embodiment similar to that of FIG. 18 but with the following differences. The PV modules 84 are aligned with edges 94, 96 spaced apart and opposite one another to create a skylight type of look as compared to the shingle look of FIG. 18. Also, lower regions 122 are generally L-shaped in the embodiment of FIG. 19. The bases, such as bases 20, 82, of other embodiments may be modified to include a thermally-insulating layer.

The PV shingle assemblies 12, 80 are typically installed as a unit. However, in some situations it may be desirable to install the base and then the PV module or other barrier. FIGS. 20-23 illustrate such a system. The PV modules will differ from the PV modules of FIG. 2 primarily in that supports 24 comprise clip-type bottom support members 126 and top support members 128. This permits bases 20 and support members 126 mounted thereto to be mounted to roof 14, or other support surface, after which PV modules 22 may be secured to bases 20 using bottom and top support members 126, 128. PV modules 22 may be mounted to bases 20 only after all of bases 20 have been mounted to the support surface, or after one or a number of bases have been mounted to the support surface. Various types of connecting supports other than those shown in FIGS. 22 and 23 may also be used. Mounting PV assemblies 22 to bases 20 after one or more of the bases have been mounted to the support surface has several advantages: 1) the roof can be shingled and hence waterproofed in advance of buying and shipping the relatively expensive PV component, 2) there is better control over the security of the PV component, since prepreparation of the underlying bases would ensure that the PV would not need to be stored for prolonged periods on the construction site, 3) minimizing storage of the PV component on the constrution site would ensure that it is not damaged by workers or flying debris, and 4) installation of the bases prior to the PV would enable other construction trades to access areas of the roof prior to PV attachment, without danger of damaging the PV.

Modification and variation can be made to the disclosed embodiments without departing from the subject of the invention as defined in the following claims. For example, shingle assembly 80 may consist of barriers 84 which may be both photovoltaic and non-photovoltaic in a single assembly; base 82 may have barriers 84 attached in some locations within shingle assembly 80, while not in other locations; PV Module 84 may be a flexible pv module, and support 24 may be integral to, or preformed with, base 20 and/or barrier 32.

Any and all patents, patent applications and printed publications referred to above are incorporated by reference.

What is claimed is:

1. A shingle system, for use on an inclined surface having an upper edge and a lower edge, comprising:
    a plurality of shingle assemblies, at least some of said shingle assemblies comprising:
        a barrier;
        a water resistant base;
        a support securing the barrier to the base; and
        a venting region defined between the barrier and the base and fluidly coupled to the ambient atmosphere for temperature regulation;
    said shingle assemblies arranged in an array, said array comprising a plurality of rows of said shingle assemblies; and
    the base comprising an insulation layer underlying a water barrier, said water barrier having a lower water barrier portion extending beyond said underlying insulation barrier so said lower water barrier portion of one said row of shingle assemblies overlies an upper portion of the water barrier of an adjacent row of shingle assemblies.

2. The system according to claim 1 wherein the lower and upper water barrier portions have interengaging regions which help to create water breaks.

3. The system according to claim 2 wherein the insulation layers comprise recessed regions corresponding to the interengaging regions.

4. The system according to claim 1 wherein said shingle assemblies of one said row are laterally offset from the shingle assemblies of an adjacent one of said rows.

5. The system according to claim 1 wherein said shingle assemblies of one said row are laterally aligned with the shingle assemblies of an adjacent one of said rows.

6. The system according to claim 1 wherein said overlapping barriers define a gap therebetween, said gap having an average separation.

7. The system according to claim 6 wherein said average separation is about 0-5 cm.

8. The system according to claim 6 wherein said average separation is about 0.6-2.5 cm.

9. The system according to claim 6 wherein said average separation is about 0.6-1.9 cm.

10. The system according to claim 6 further comprising an air-permeable debris barrier at said gap.

11. The system according to claim 1 wherein the barriers comprise PV modules having electrical connection elements.

12. The assembly according to claim 11 wherein the electrical connection elements comprise wires and connectors in said venting regions.

13. The assembly according to claim 11 wherein the electrical connection elements comprise electrical connectors formed integrally with at least one of the PV module, base and support.

14. The system according to claim 1 wherein the water resistant base is an effectively waterproof base.

15. The system according to claim 1 wherein said barrier comprises a photovoltaic (PV) module and said shingle assembly comprises a PV shingle assembly.

16. The system according to claim 1 wherein the array has an edge, and further comprising a deflector at the array edge so to help promote proper airflow through the venting regions while helping to prevent debris from entering a venting region.

17. A photovoltaic (PV) module shingle system, for use on an inclined surface having an upper edge and a lower edge, comprising:
    a plurality of shingle assemblies, at least some of said shingle assemblies comprising:
        a PV module;
        a water resistant base;
        a support securing the PV module to the base;
        said base comprising:
            first and second edges, and said first and second edges comprising first and second interengageable elements so that said first edge of one base is interengageable with said second edge of an adjacent base to be capable of resisting first and second disengaging forces, said first disengaging force oriented perpendicular to said edges along a plane oriented parallel to the base, said second disengaging force oriented perpendicular to said edges along a plane oriented perpendicular to the base; and
            an insulation layer underlying a water barrier; and
        a venting region defined between the PV module and the base and fluidly coupled to the ambient atmosphere for temperature regulation;
    said shingle assemblies arranged in an array, said array comprising a plurality of rows of said shingle assemblies;
    the PV modules of one said row overlapping the PV modules of an adjacent one of said rows; and
    a deflector at the array edge so to help promote proper airflow through the venting regions while helping to prevent debris from entering the venting region.

* * * * *